US008107512B2

(12) United States Patent
Gao et al.

(10) Patent No.: US 8,107,512 B2
(45) Date of Patent: Jan. 31, 2012

(54) METHOD AND APPARATUS FOR ROBUST AUTOMATIC FREQUENCY CONTROL IN CDMA SYSTEMS WITH CONSTANT PILOT SIGNALS

(75) Inventors: Wen Gao, Plainsboro, NJ (US); Zoran Kostic, Holmdel, NJ (US); Alton Shelbourne Keel, Melbourne, FL (US)

(73) Assignee: Thomson Licensing, Boulogne-Billancourt (FR)

( * ) Notice: Subject to any disclaimer, the term of this patent is extended or adjusted under 35 U.S.C. 154(b) by 1560 days.

(21) Appl. No.: 10/590,558

(22) PCT Filed: Mar. 8, 2004

(86) PCT No.: PCT/US2004/006807
§ 371 (c)(1),
(2), (4) Date: Aug. 24, 2006

(87) PCT Pub. No.: WO2005/099205
PCT Pub. Date: Oct. 20, 2005

(65) Prior Publication Data
US 2007/0165703 A1  Jul. 19, 2007

(51) Int. Cl.
*H04B 1/00* (2006.01)
(52) U.S. Cl. ........ 375/148; 375/136; 375/140; 375/130; 375/150; 375/142; 375/147; 375/143; 375/344; 455/75; 455/136; 455/164.1; 455/164.2; 370/335; 370/441; 370/342
(58) Field of Classification Search .................. 375/136, 375/142, 143, 324, 345, 344, 130, 140, 150, 375/147, 75, 164.1, 164.2; 455/75, 136, 455/138, 182.2, 192.2, 164.1, 164.2; 370/335, 370/441, 342
See application file for complete search history.

(56) References Cited

U.S. PATENT DOCUMENTS

| 5,740,205 | A | * | 4/1998 | Baum et al. | 375/344 |
| 5,812,615 | A | * | 9/1998 | Baum et al. | 375/344 |
| 5,999,561 | A | * | 12/1999 | Naden et al. | 375/142 |
| 6,046,618 | A | | 4/2000 | Lee | |
| 6,229,991 | B1 | * | 5/2001 | Hietala et al. | 455/75 |
| 6,304,620 | B1 | * | 10/2001 | Rouphael | 375/344 |
| 6,363,102 | B1 | * | 3/2002 | Ling et al. | 375/147 |
| 6,370,133 | B1 | * | 4/2002 | Kang et al. | 370/342 |

(Continued)

FOREIGN PATENT DOCUMENTS

| EP | 0856962 | 8/1998 |
| KR | 2001-018409 | 3/2001 |
| WO | WO 02/080424 | 10/2002 |

OTHER PUBLICATIONS

Search Report Dated Sep. 2, 2004.

*Primary Examiner* — Khanh C Tran
*Assistant Examiner* — Rahel Guarino
(74) *Attorney, Agent, or Firm* — Robert D. Shedd; Robert B. Levy

(57) ABSTRACT

There is provided a method for generating an error signal for an automatic frequency control (AFC) loop in a Code Division Multiple Access (CDMA) system. Sign information relating to phase differences in received pilot signals is accumulated. In one embodiment, the accumulated sign information is compared against predetermined threshold levels. The error signal is generated when at least one of the predetermined threshold levels is satisfied. In a second embodiment, the accumulated sign information is decimated. An output of the decimating step is utilized as the error signal for the AFC loop.

31 Claims, 2 Drawing Sheets

U.S. PATENT DOCUMENTS

| | | |
|---|---|---|
| 6,493,406 B1 | 12/2002 | Schweickert et al. |
| 6,728,301 B1 * | 4/2004 | Chrisikos ................... 375/147 |
| 6,741,665 B2 * | 5/2004 | Kenney et al. ............. 375/344 |
| 6,748,029 B1 | 6/2004 | Lee |
| 7,010,020 B2 * | 3/2006 | Bultan et al. .............. 375/148 |
| 7,715,463 B2 * | 5/2010 | Li ............................... 375/147 |
| 7,724,817 B2 * | 5/2010 | Pietraski et al. .......... 375/232 |
| 2002/0067788 A1 * | 6/2002 | Gregorian et al. ........ 375/376 |
| 2002/0114405 A1 | 8/2002 | Sindhushayana et al. |
| 2003/0128678 A1 | 7/2003 | Subrahmanya et al. |
| 2003/0235258 A1 | 12/2003 | Kenney et al. |
| 2004/0071116 A1 | 4/2004 | You et al. |

* cited by examiner

METHOD AND APPARATUS FOR ROBUST AUTOMATIC FREQUENCY CONTROL IN CDMA SYSTEMS WITH CONSTANT PILOT SIGNALS

This application claims the benefit, under 35 U.S.C. §365 of International Application PCT/US2004/006807, filed 8 Mar. 2004, which was published in accordance with PCT Article 21(2) on Oct. 20, 2005 in English.

BACKGROUND OF THE INVENTION

1. Field of the Invention

The present invention generally relates to wireless Code Division. Multiple Access (CDMA) systems and, more particularly, to automatic frequency control (AFC) in CDMA systems with constant pilot signals.

2. Background of the Invention

In passband CDMA systems, the receivers usually need to generate a local carrier to demodulate the received signal. An automatic frequency control (AFC) operation of the CDMA systems generates a local carrier using a frequency close to the transmitter carrier frequency, and also tracks the deviation of the local frequency from the transmitter frequency distorted by channel propagation. For CDMA systems, such as, for example, Interim Standard-96 (IS-95) and Universal Mobile Telecommunications System (UMTS), a constant pilot signal is used to perform the AFC operation.

In CDMA systems, the pilot signal used for the AFC operation is demodulated to the in-phase and quadrature baseband signal using the generated local carrier. However, the frequency of the local carrier is usually different from the frequency of the transmitter carrier. In UMTS systems, due to component inaccuracies and channel variations, the frequency difference could be as high as 10 KHz, which can have the effect of severely degrading the receiver performance. An AFC loop is therefore exploited to reduce the frequency difference to a level that introduces only a negligible performance loss.

In AFC operation, a feedback loop is formed, commonly referred to as an AFC loop. In this loop, an error signal representing the difference between the local carrier and the transmitter carrier frequency is computed and filtered. The filtered output is then used to adjust the local carrier frequency. As such, the quality of the error signal directly affects the performance of the AFC loop.

In a conventional AFC loop in CDMA systems, pilot signals are first despread to obtain despread symbols. The phase difference between the current despread symbol and the previous despread symbol is computed, representing the residual frequency offset between the local carrier and the transmitter carrier. The phase difference signal is filtered using a first-order or second-order loop filter in order to generate the error signal. However, due to the severe fading effect in wireless channels, this type of error signal usually has a large variation, even after the filtering operation, and thus can make the AFC loop unstable. Many proposed AFC loops are not robust in the presence of mobile channel degradations.

Accordingly, it would be desirable and highly advantageous to have an AFC loop for a CDMA system that overcomes the above-described problems of the prior art.

SUMMARY OF THE INVENTION

The problems stated above, as well as other related problems of the prior art, are solved by the present invention, which is directed to a robust Automatic Frequency Control (AFC) control for Code Division Multiple Access (CDMA) Systems with constant pilot signals, According to an aspect of the present invention, there is provided a method for generating an error signal for an automatic frequency control (AFC) loop in a CDMA system. Sign information relating to phase differences in received pilot signals is accumulated. The accumulated sign information is compared against predetermined threshold levels. The error signal is generated when at least one of the predetermined threshold levels is satisfied.

According to another aspect of the present invention, there is provided a method for generating an error signal for an automatic frequency control (AFC) loop in a CDMA system. Sign information relating to phase differences in received pilot signals is accumulated. The accumulated sign information is decimated. An output of the decimating step is utilized as the error signal for the AFC loop.

These and other aspects, features and advantages of the present invention will become apparent from the following detailed description of preferred embodiments, which is to be read in connection with the accompanying drawings.

DETAILED DESCRIPTION OF THE INVENTION

The present invention is directed to methods and apparatus for robust Automatic Frequency Control (AFC) in Code Division Multiple Access (CDMA) systems with constant pilot signals.

It is to be understood that the present invention may be implemented in various forms of hardware, software, firmware, special purpose processors, or a combination thereof. Preferably, the present invention is implemented as a combination of hardware and software. Moreover, the software is preferably implemented as an application program tangibly embodied on a program storage device. The application program may be uploaded to, and executed by, a machine comprising any suitable architecture. Preferably, the machine is implemented on a computer platform having hardware such as one or more central processing units (CPU), a random access memory (RAM), and input/output (I/O) interface(s). The computer platform also includes an operating system and microinstruction code. The various processes and functions described herein may either be part of the microinstruction code or part of the application program (or a combination thereof) that is executed via the operating system. In addition, various other peripheral devices may be connected to the computer platform such as an additional data storage device and a printing device.

It is to be further understood that, because some of the constituent system components and method steps depicted in the accompanying Figures are preferably implemented in software, the actual connections between the system components (or the process steps) may differ depending upon the manner in which the present invention is programmed. Given the teachings herein, one of ordinary skill in the related art will be able to contemplate these and similar implementations or configurations of the present invention.

Figure 1:
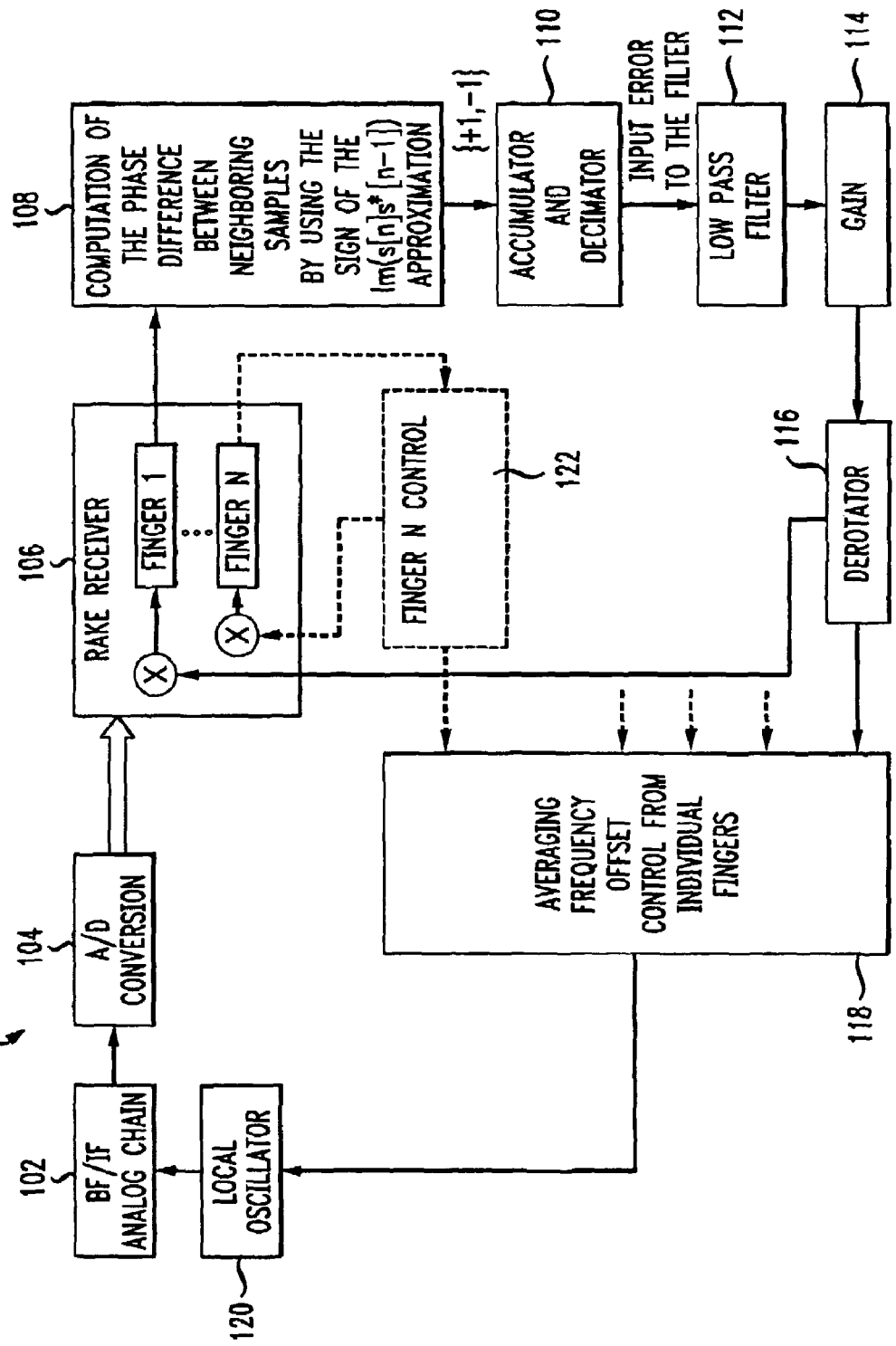
FIG. 1 is a diagram illustrating an exemplary Automatic Frequency Control (AFC) loop 100 for a Code Division Multiple Access (CDMA) system, according to an illustrative embodiment of the present invention.

FIG. 1 is a diagram illustrating an exemplary Automatic Frequency Control (AFC) loop 100 for a Code Division Multiple Access (CDMA) system, according to an illustrative embodiment of the present invention. The AFC loop 100 includes a Radio Frequency/Intermediate Frequency (RF/IF) analog chain 102, an Analog-to-Digital Converter (ADC) 104, a rake receiver 106, a phase difference computing module 108, an accumulator and decimator 110, a Low Pass Filter (LPF) 112, a gain module 114, a derotator 116, an averaging frequency offset control module 118, a local oscillator 120, and a finger N control module 122. As used herein, the finger N control module 122 represents a respective copy of each of modules 108, 110, 112, 114, and 116 for each of the fingers of the rake receiver 106. That is, modules 108 through 116 correspond to the first finger of the rake receiver 106 and copies of these modules are respectively repeated for each other finger of the rake receiver 106 up to a $N^{th}$ finger. It is to be appreciated that the rake receiver 106 has fingers 1 through N associated therewith, each finger serving as a receiving element.

An analog pilot signal is output from the RF/IF analog chain 102, converted to a digital signal by the ADC 104, and fed into the rake receiver 106 where it is despread. The phase differences between the despread pilot signal samples output from the rake receiver 106 are computed by the phase difference computing module 108. The signs [+1, −1] of the phase differences are accumulated in the accumulator and decimator 110. The output of the accumulator and decimator 110 is an error signal that is input to the LPF 112. The output signal of the LPF 112 is applied to the gain module 114, which amplifies the signal as needed. The output signal from the gain module 114 is input into the derotator 116 that completes a feedback loop with the fingers 1–(N−1) of rake receiver 106. The derotator 116 performs the complex multiplication that is supposed to eliminate the frequency offset in the receiver.

Frequency offset control signals from the individual fingers of the rake receiver are averaged by the averaging frequency offset control module 118 and the resulting error signal that is output from module 118 is then input to the local oscillator 120 to control the local oscillator 120.

Figure 2:
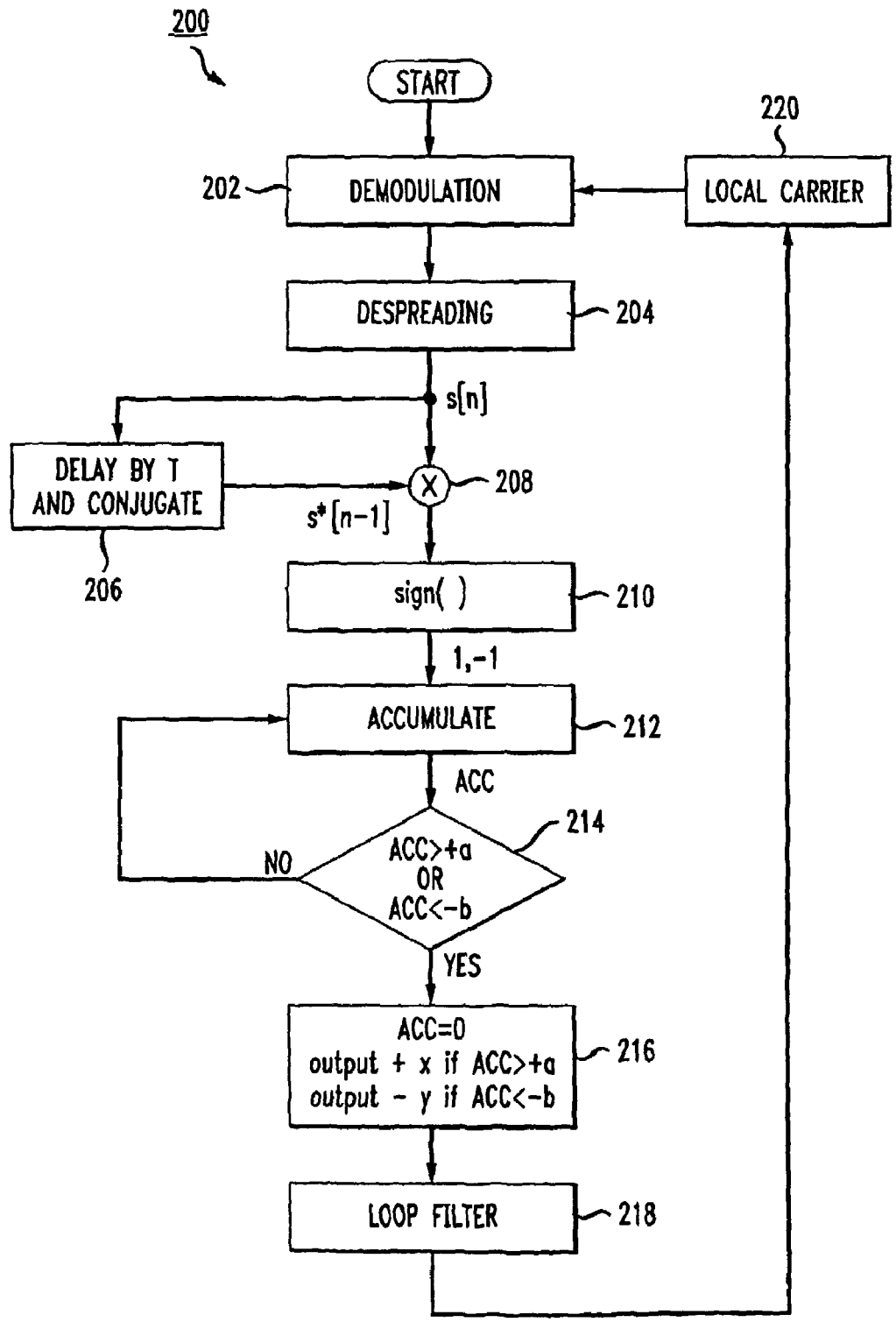
FIG. 2 is a flow diagram illustrating a method 200 for generating an error signal for an Automatic Frequency Control (AFC) loop in a Code Division Multiple Access (CDMA) system, according to an illustrative embodiment of the present invention.

FIG. 2 is a flow diagram illustrating a method 200 for generating an error signal for an Automatic Frequency Control (AFC) loop in a Code Division Multiple Access (CDMA) system, according to an illustrative embodiment of the present invention.

The pilot signal is demodulated (202) with respect to the local carrier (220), and is then sampled and despread to obtain despread pilot symbols s[n] (step 204). For convenience, the despread pilot symbols s[n] are modeled as follows:

$$s[n]=A[n]\exp(j2\pi\Delta fnT+\phi[n])+w[n]$$

where $A[n]\exp(\phi[n])$ represents the fading channel coefficient, $\Delta f$ represents the frequency difference between the local carrier and transmitter carrier, T represents the period of the despreading operation, and w[n] represents the noise plus the interference.

The despread pilot symbols s[n] are delayed by T (i.e., the period of the dispreading operation performed by the rake receiver 106) and conjugated to produce s*[n−1] (step 206), which provides the reference pilot signal used for purposes such as data demodulation and synchronization. A multiplication operation is then performed (208) as follows:

$$s[n]s*[n-1]=A[n]A[n-1]\exp(j2\pi\Delta fT+\phi[n]-[n-1])+v[n],$$

where v[n] accounts for the effect of the noise and interference. That is, the current despread pilot signal is multiplied with the complex conjugate of the previous despread pilot signal. Under slow fading and a moderately fast fading environment, it can be presumed that $\phi[n]\cong\phi[n-1]$ or the effect of noise and interference can be placed into the term v[n] to produce:

$$s[n]s*[n-1]=A[n]A[n-1]\exp(j2\pi\Delta fT)+v[n].$$

Note that the angle of s[n]s*[n−1] can be an error signal indicating the frequency difference between the local carrier and transmitter carrier. To compute the phase angle of s[n]s*[n−1] exactly, a division operation is required, which is undesirable in practical implementations. The common approach is to use the imaginary part of s[n]s*[n−1], denoted as Im(s[n]s*[n−1]). However, Im(s[n]s*[n−1]) is noisy and its absolute value may have large variation due to the fading effects in the wireless channel.

Thus, instead of directly using the imaginary part of the product resulting from step 208 (i.e., Im(s[n]s*[n−1])) as in the prior art, the present invention advantageously extracts the sign value of the imaginary part (step 210) for use in computing the phase angle. The sign value [+1 or −1] of the imaginary part of the product reflects the frequency difference between the local carrier (generated by local oscillator 120) and the transmitter carrier. The sign value, which is either equal to −1 or +1, is accumulated in the accumulator 110 (step 212). That is, the sign value is added to the previous content in the accumulator 110. The accumulator value output from the accumulator is compared against two thresholds (+a and −b) (step 214). If one of the thresholds is satisfied, then an error signal is generated and the accumulator value ACC is then reset to zero. (step 216). If the accumulator value ACC is greater than the threshold +a, then a positive constant error signal +x is generated. If the accumulator value ACC is below the threshold −b, then a negative constant error signal −y is generated. The comparison step and the generation of the error signal are both performed by the accumulator and decimator 110. However, it is to be appreciated that in some embodiments of the present invention, a separate comparator may be disposed in between the accumulator and decimator 110 and the LPF 112 to perform the comparing and generating steps. In the case that the thresholds are not satisfied, then the accumulator continues to accumulate values without resetting. It is to be noted that values x and y act as gains in the control loop.

According to another embodiment of the present invention, the accumulator and decimator 110, in addition to performing accumulation, also performs decimation. In this case, for every t (threshold) input samples, the decimator is reset to zero, and at the same interval the output of the decimator is passed as an error signal to the LPF 112. In this case, as opposed to the previously described one, there are no fixed gains x and y that need to be determined. Moreover, in this case, there are no thresholds +a and −b that need to be applied. As is known, a decimator having a certain input rate will correspondingly have a reduced output rate, with each input symbol or bit being "stretched" or repeated at the output to form a continuous output at the reduced rate. Thus, in this embodiment, the accumulator and decimator 110 performs both accumulation and decimation, in contrast to other embodiments wherein the accumulator and decimator 306 is simply an accumulator that performs accumulation but not decimation.

The threshold values +a, −b and the constant error signals +x, −y can be adjusted to change the AFC loop characteristics. Such adjustments can be a function of the desired bandwidth and gain of the AFC loop. Changes to the threshold values +a and −b will affect the bandwidth of the AFC loop, and changes to the constants +x and −y will affect the gain of the AFC loop. Changes to a, b, x and/or y can be done during the calibration of the rake receiver 106, or adaptively as a function of the Doppler estimation or other parameters that determine the optimal bandwidth of the AFC loop.

The generated error signal is further passed to the LPF 112 (step 218) to limit the noise in the signal, and the output of the LPF 112 is used to adjust the frequency of the local carrier. By way of example, the commonly used LPF is a second order low pass filter, as follows:

$$i[n]=i[n-1]+\beta *e[n],$$

$$out[n]=\alpha *e[n]+i[n],$$

where α and β are the filter coefficients, i[n] is the integral part of the LPF 112, α*e[n] is the proportional part of the LPF 112, and out[n] is the LPF 112 output. Those of ordinary skill in the art will recognize that other loop filters may be implemented without departing from the spirit of the present invention.

Although the illustrative embodiments have been described herein with reference to the accompanying drawings, it is to be understood that the present invention is not limited to those precise embodiments, and that various other changes and modifications may be affected therein by one of ordinary skill in the related art without departing from the scope or spirit of the invention. All such changes and modifications are intended to be included within the scope of the invention as defined by the appended claims.

What is claimed is:

1. A method for Automatic Frequency Control in a Code Division Multiple Access system, comprising the steps of:
   accumulating sign information relating to phase differences in received signals;
   comparing the accumulated sign information against predetermined threshold levels;
   generating an error signal when at least one of the predetermined threshold levels is satisfied; and
   controlling gain in an Automatic Frequency Control (AFC) loop in the Code Division Multiple Access system in accordance with the error signal.

2. The method according to claim 1, further comprising the steps of:
   multiplying a current despread pilot signal with a complex conjugate of a previous despread pilot signal; and
   obtaining a sign value of a product of said multiplying step.

3. The method according to claim 2, wherein said step of obtaining a sign value comprises the step of extracting the sign value of an imaginary part of the product of said multiplying step.

4. The method according to claim 1, wherein said predetermined threshold levels include a positive threshold and a negative threshold.

5. The method according to claim 4, wherein said generating step comprises the steps of generating a positive constant error signal when the positive threshold is satisfied, and generating a negative constant error signal when the negative threshold level is satisfied.

6. The method according to claim 1, wherein the values of the error signals are constant values.

7. The method according to claim 1, further comprising the step of utilizing the predetermined threshold levels to affect a bandwidth of the Automatic Frequency Control (AFC) loop.

8. The method according to claim 1, further comprising the step of resetting the accumulated sign information when the error signal is generated.

9. A method for generating an error signal for an Automatic Frequency Control (AFC) loop in a Code Division Multiple Access (CDMA) system, comprising the steps of:
   accumulating sign information relating to phase differences in received pilot signals;
   decimating the accumulated sign information;
   utilizing an output of said decimating step as the error signal for the AFC loop;
   multiplying a current despread pilot signal with a complex conjugate of a previous despread pilot signal; and
   obtaining a sign value of a product of said multiplying step.

10. The method according to claim 9, wherein said step of obtaining the sign value comprises the step of extracting the sign value of an imaginary part of the product of said multiplying step.

11. The method according to claim 9, wherein the output of said decimating step is utilized as the loop error signal upon a decimation of a threshold number of the samples.

12. The method according to claim 11, further comprising the step of resetting the output of said decimating step at a same interval as when the output of said decimating step is utilized as the loop error signal.

13. An apparatus for generating an error signal for an Automatic Frequency Control (AFC) loop in a Code Division Multiple Access (CDMA) system, comprising:
   an accumulator for accumulating sign information relating to phase differences in received pilot signals;
   a decimator for decimating the accumulated sign information so as to output the error signal therefrom;
   wherein the output of said decimator is utilized as the error signal upon a decimation of a threshold number of the samples; and
   wherein the output of said decimator is reset at a same interval as when the output of said decimator is utilized as the error signal.

14. A method for generating an error signal for an Automatic Frequency Control (AFC) loop in a Code Division Multiple Access (CDMA) system for Automatic Frequency Control, comprising the steps of:
   accumulating sign information relating to phase differences between samples of a received code sequence;
   comparing the accumulated sign information against adaptable threshold levels;
   generating the error signal when at least one of the adaptable threshold levels is satisfied; and
   controlling gain in the Automatic Frequency Control loop in the Code Division Multiple Access system in accordance with the error signal.

15. The method according to claim 14, wherein the adaptable threshold levels include a positive threshold and a negative threshold.

16. The method according to claim 15, wherein said generating step comprises the step of generating a positive constant error signal when the positive threshold is satisfied, and generating a negative constant error signal when the negative threshold level is satisfied.

17. The method according to claim 14, wherein the values of the error signal are constant values capable of being adjusted to control the gain in Automatic Frequency Control loop.

18. The method according to claim 14, further comprising the step of utilizing the adaptable threshold levels to affect a bandwidth of the Automatic Frequency Control loop.

19. The method according to claim 14, further comprising the steps of:

retrieving samples of the received code with different delays from a sample buffer in the Automatic Frequency Control (AFC) loop and;

adjusting a position of the samples in the sample buffer based on the error signal.

20. The method according to claim 19, further comprising the step of filtering the error signal prior to said adjusting step.

21. An apparatus for generating an error signal for an Automatic Frequency Control (AFC) loop in a Code Division Multiple Access (CDMA) system, comprising:

an accumulator for accumulating sign information relating to phase differences between samples of a received code sequence;

a comparator for comparing the accumulated sign information against adaptable threshold levels; and an error signal generator for generating the error signal when at least one of the adaptable threshold levels is satisfied.

22. The apparatus according to claim 21, wherein said error signal generator generates a positive constant error signal when a positive threshold is satisfied, and generates a negative constant error signal when a negative threshold level is satisfied.

23. The apparatus according to claim 22, wherein the positive constant error signal and the negative constant error signal control gain of the Automatic Frequency Control loop.

24. The apparatus according to claim 21, further comprising a sample buffer for allowing the samples of the received code sequence to be retrieved there from with different delays, and for adjusting positions of the samples in the buffer based on the error signal.

25. The apparatus according to claim 24, further comprising a filter for filtering the error signal prior to adjusting the positions of the samples in the sample buffer.

26. A method for generating an error signal for an Automatic Frequency Control (AFC) loop in a Code Division Multiple Access (CDMA) system to achieve AFC, comprising the steps of:

accumulating sign information relating to phase differences between samples of a received code sequence;

decimating the accumulated sign information;

utilizing an output of said decimating step as the error signal for the AFC loop upon a decimation of a threshold number of the samples;

controlling gain in the AFC loop in the CDMA system in accordance with the error signal; and resetting the output of said decimating step at a same interval as when the output of said decimating step is utilized as the error signal.

27. The method according to claim 26, further comprising the steps of:

retrieving samples of the received code with different delays from a buffer in the Automatic Frequency Control loop and; and adjusting a position of the samples in the buffer based on the error signal.

28. The method according to claim 27, further comprising the step of filtering the error signal prior to said adjusting step.

29. An apparatus for generating an error signal for an Automatic Frequency Control (AFC) loop in a Code Division Multiple Access (CDMA) system, comprising:

an accumulator for accumulating sign information relating to phase differences between samples of a received code sequence; and a decimator for receiving the accumulated sign information from said accumulator and for decimating the accumulated sign information, wherein an output of said decimator is utilized as the error signal for the AFC loop upon a decimation of a threshold number of the samples;

wherein the output of said decimator is reset at a same interval as when the output of said decimator is utilized as the error signal.

30. The apparatus according to claim 29, further comprising a sample buffer for allowing the samples of the received code sequence to be retrieved there from with different delays, and for adjusting positions of the samples in the buffer based on the error signal.

31. The apparatus according to claim 30, further comprising a filter for filtering the error signal prior to adjusting the positions of the samples in the sample buffer.

* * * * *